United States Patent [19]

Lien

[11] Patent Number: 5,250,854
[45] Date of Patent: Oct. 5, 1993

[54] BITLINE PULL-UP CIRCUIT OPERABLE IN A LOW-RESISTANCE TEST MODE

[75] Inventor: Chuen-Der Lien, Mountain View, Calif.

[73] Assignee: Integrated Device Technology, Inc., Santa Clara, Calif.

[21] Appl. No.: 794,471

[22] Filed: Nov. 19, 1991

[51] Int. Cl.$^5$ .................. H03K 3/01; H03K 17/16
[52] U.S. Cl. .................. 307/296.1; 307/568; 307/475; 307/443; 365/189.11; 365/201
[58] Field of Search .............. 307/443, 475, 296.1, 307/296.3, 296.2, 567, 568, 296.8; 365/189.11, 201, 188, 189.09

[56] References Cited

U.S. PATENT DOCUMENTS

| 4,839,865 | 6/1989 | Sato et al. | 365/201 |
| 5,079,744 | 1/1992 | Tobita et al. | 365/201 |
| 5,109,257 | 4/1992 | Konda | 365/201 |
| 5,128,555 | 7/1992 | Millman | 307/443 |
| 5,132,929 | 7/1992 | Ochii | 365/201 |

*Primary Examiner*—Edward P. Westin
*Assistant Examiner*—Richard Roseen
*Attorney, Agent, or Firm*—Limbach & Limbach

[57] ABSTRACT

A method and apparatus for raising bitlines selectively to desired voltage levels. The circuit of the invention can be controlled to operate either in a first mode (for raising the bitlines selectively to relatively low voltage levels) or in a second mode (for raising the bitlines to desired higher voltage levels). The circuit of the invention has two branches, one of which includes a first (NMOS or bipolar) transistor and preferably also one or more resistors connected in series with a terminal (other than the gate or base) of the first transistor. The second branch includes a PMOS or NMOS transistor. When the PMOS (or NMOS) transistor of the second branch is switched off, the circuit's first branch operates as a bitline pull-up circuit (for raising a bitline selectively to relatively low voltage levels). When the PMOS (or NMOS) transistor of the second branch is switched on (for example, to initiate a test mode), the second branch shunts out the first branch and raises the bitline to a higher desired voltage level.

24 Claims, 3 Drawing Sheets

BITLINE PULL-UP CIRCUIT OPERABLE IN A LOW-RESISTANCE TEST MODE

FIELD OF THE INVENTION

The invention relates to electronic circuitry for raising bitlines selectively to desired voltage levels. More particularly, the invention relates to electronic circuitry operable in a mode having high electrical resistance to raise bitlines selectively to relatively low voltage levels, or in a mode having low resistance to raise the same bitlines selectively to higher voltage levels.

BACKGROUND OF THE INVENTION

Many SRAM circuits employ bitline pull-up circuitry to raise SRAM bitlines selectively to desired voltage levels. A conventional circuit of this type is shown in FIG. 1. In the FIG. 1 circuit, the drains of NMOS transistors N1, N2, N3, and N4 are connected to a line maintained at voltage $V_{cc}$. The sources of transistors N1, N2, N3, and N4 are connected, respectively, to bitlines $B_1$, $-B_1$, $B_2$, and $-B_2$. Voltage $V_{a1}$ (applied to the gate of transistor N1) is controlled in order to switch transistor N1 on and off selectively, thereby pulling bitline $B_1$ selectively up to a voltage level substantially equal to $V_{cc}-V_{Th}$ (where $V_{Th}$ is the threshold voltage between the gate and source of transistor N1, at which N1 begins to conduct). Similarly, voltages $V_{a2}$, $V_{a3}$, and $V_{a4}$ (applied to the gates of transistors N2, N3, and N4, respectively) are controlled to switch transistors N2, N3, and N4 on and off, thereby pulling bitlines $-B_1$, $B_2$, and $-B_2$ selectively up to $V_{cc}-V_{Th}$.

FIG. 2 is a conventional variation on the circuit of FIG. 1, which employs resistors to reduce the current $I_{cc}$ during normal circuit operation. Specifically, the FIG. 2 circuit employs resistor R1 (connected between voltage $V_{cc}$ and the drain of transistor N1), resistor R2 (connected between bitline $B_1$ and the source of transistor N1), resistor R3 (connected between voltage $V_{cc}$ and the drain of transistor N2), and resistor R4 (connected between bitline $-B_1$ and the source of transistor N2) to reduce the current $I_{cc}$. In variations on FIG. 2 circuit, one or more of the resistors R1, R2, R3, and R4 can be omitted.

SRAM cells can be disturbed by electron or hole carriers generated by nearby junction leakage or other carrier generation mechanisms. The effect of such disturbances on an SRAM cell is less severe to the extent that the bitlines are pulled up to lower voltages. By reducing bitline voltages during normal operation, hot electron degradation on circuitry connected to the bitlines (e.e., SRAM cell pass gates) is also reduced, and good voltage matches to the input of sense amplifiers (not shown) can be achieved.

Another type of conventional bitline pull-up circuit is shown in FIG. 3. In FIG. 3, a line maintained at voltage $V_{cc}$ is connected to the drain of NMOS transistor N1, and the source of transistor N1 is connected to the common source of PMOS transistors P1, P2, P3, and P4 (which is at the voltage level $V_{com}$). The drains of transistors P1, P2, P3, and P4 are connected, respectively, to bitlines $B_1$, $-B_1$, $B_2$, and $-B_2$. The voltages $V_{e1}$, $V_{e2}$, $V_{e3}$, and $V_{e4}$ supplied to the PMOS transistor gates are controlled to switch transistors P1, P2, P3, and P4 on and off, respectively, thereby pulling bitlines $B_1$, $-B_1$, $B_2$, and $-B_2$ selectively up to a voltage substantially equal to $V_{com}$.

FIG. 4 is a conventional variation on the FIG. 3 circuit, in which resistors are employed to reduce the currents $I_{cc}$ and $I_{com}$ during operation thereof. Specifically, the FIG. 4 circuit employs resistor R1 (connected between voltage $V_{cc}$ and the drain of transistor N1), resistor R2 (connected between the source of transistor N1 and the common source of transistors P1 and P2), resistor R3 (connected between voltage $V_{com}$ and the source of transistor P1), resistor R4 (connected between bitline B and the drain of transistor P1), resistor R5 (connected between voltage $V_{com}$ and the source of transistor P2), and resistor R6 (connected between bitline $-B$ and the drain of transistor PN2) to reduce said currents. In variations on FIG. 4 circuit, one or more of the resistors R1, R2, R3, R4, R5, and R6 can be omitted. The FIG. 4 circuit has the advantages of reduced disturbance (due to nearby junction leakage) and reduced hot electron degradation discussed above with reference to FIG. 2.

In variations on the circuits of FIGS. 1 through 4, one or more of the NMOS pull-up transistors are replaced by bipolar transistors. In each such circuit, a line maintained at voltage $V_{cc}$ is preferably connected to the collector of the bipolar transistor, the emitter of each bipolar transistor is preferably connected (optionally in series with a resistor) to one of the bitlines (or to the common source of two or more PMOS transistors which are in turn connected to the bitlines), and the base of each bipolar transistor is preferably connected to one of the control voltages $V_a$ or $V_e$. However, such bipolar transistor circuits are subject to the same disadvantages and limitations as are the NMOS transistor circuits of FIGS. 1 through 4.

In order to conduct various tests of circuitry (for example, SRAM circuitry) to which bitlines are connected, it would be desirable to pull the bitlines up to a higher level than its normal operating voltage level. For example, it may be desired to screen out weak parts (e.g., parts having excessively high load resistance or excessively high junction leakage). It may also be useful to accelerate hot electron and other degradations of SRAM cells during burn-in or lifetime testing by increasing the bitline voltage level. However, the above-discussed conventional circuits have the disadvantage of being incapable of operating in both a test mode in which they raise bitlines to higher voltage levels without significant external $V_{cc}$ increase, and a normal operating mode in which they raise bitlines selectively to relatively low voltage levels.

SUMMARY OF INVENTION

The invention is an improved method and apparatus for raising bitlines selectively to desired voltage levels. The inventive circuit can be controlled to operate either in a first mode having high electrical resistance (for raising the bitlines selectively to relatively low voltage levels) or in a second mode having low resistance (for raising the bitlines to desired higher voltage levels).

In a preferred embodiment, the inventive circuit has two parallel branches: one branch including a first (NMOS or bipolar) transistor and a resistor connected in series with one or both of the first transistor's source and drain (or collector and emitter), and another branch including a PMOS transistor. When the PMOS transistor is switched off, the first branch of the circuit operates as a bitline pull-up circuit having high electrical resistance (for raising a bitline selectively to relatively low voltage levels). When the PMOS transistor is switched on (for example, to conduct tests), the circuit's second branch shunts out the first branch, and operates as a bitline pull-up circuit to raise the bitline to a higher desired voltage level.

DETAILED DESCRIPTION OF THE PREFERRED EMBODIMENT

A first preferred embodiment of the invention will be described with reference to FIG. 5. The bitline pull-up circuit of FIG. 5 has two parallel branches, both connected between a line maintained at voltage $V_{cc}$, and a single bitline (or a line at voltage $V_{com}$, to which one or more bitlines are selectively pulled as in the FIG. 7 embodiment discussed below). The first branch of the FIG. 5 circuit includes NMOS transistor N1, resistor R1 (connected between the voltage line $V_{cc}$ and the drain of transistor N1), and resistor R2 (connected between transistor N1's source, and the bitline or the line at voltage $V_{com}$). The second branch of the FIG. 5 circuit consists of PMOS transistor P1 whose source is connected to the $V_{cc}$ line and whose drain is connected to the bitline (or the line at voltage $V_{com}$).

Figure 1:
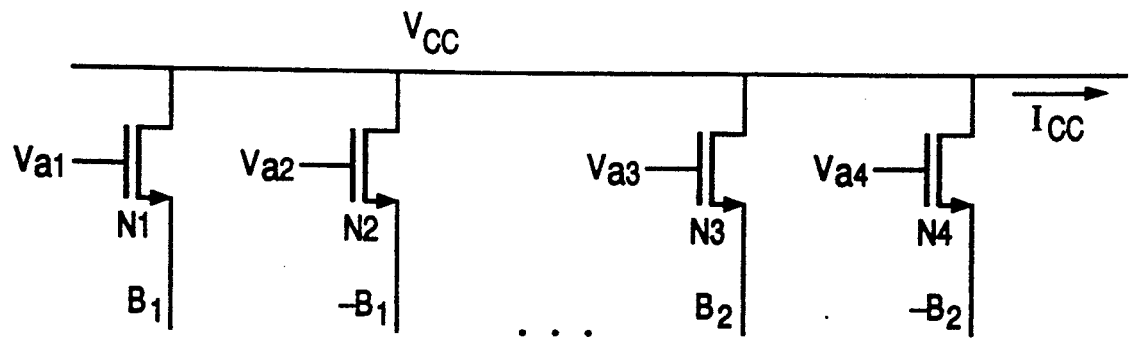
FIG. 1 is a circuit diagram of a conventional bitline pull-up circuit.
Figure 2:
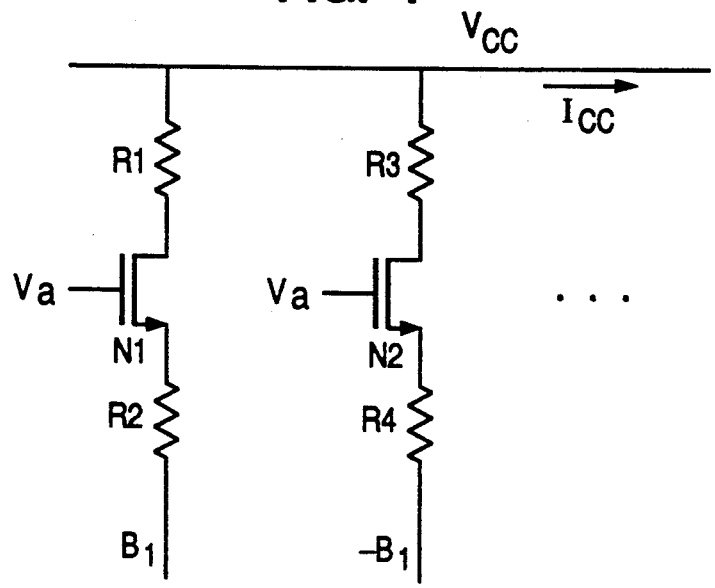
FIG. 2 is a circuit diagram of a second conventional bitline pull-up circuit.
Figure 3:
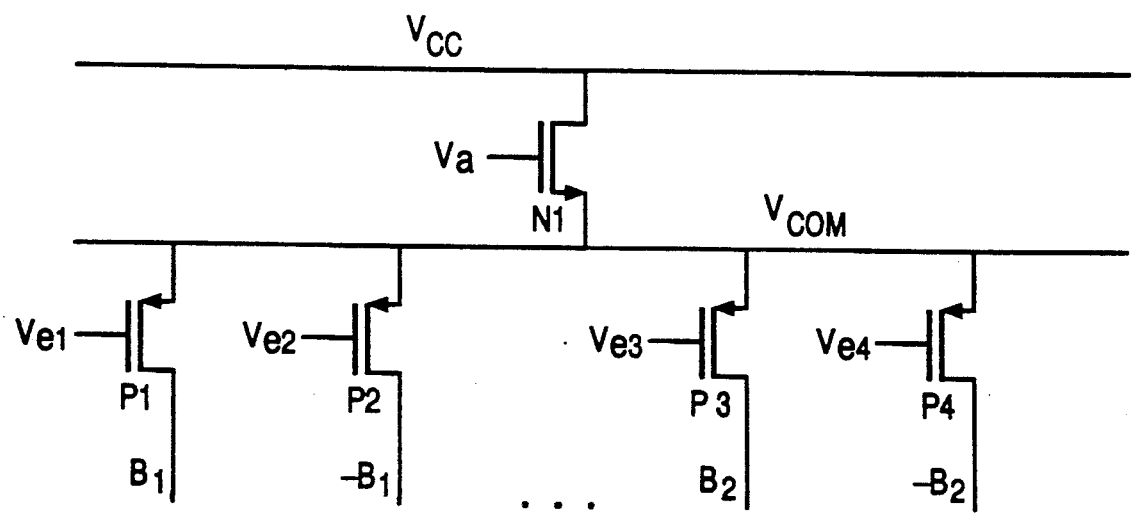
FIG. 3 is a circuit diagram of a third conventional bitline pull-up circuit.
Figure 4:
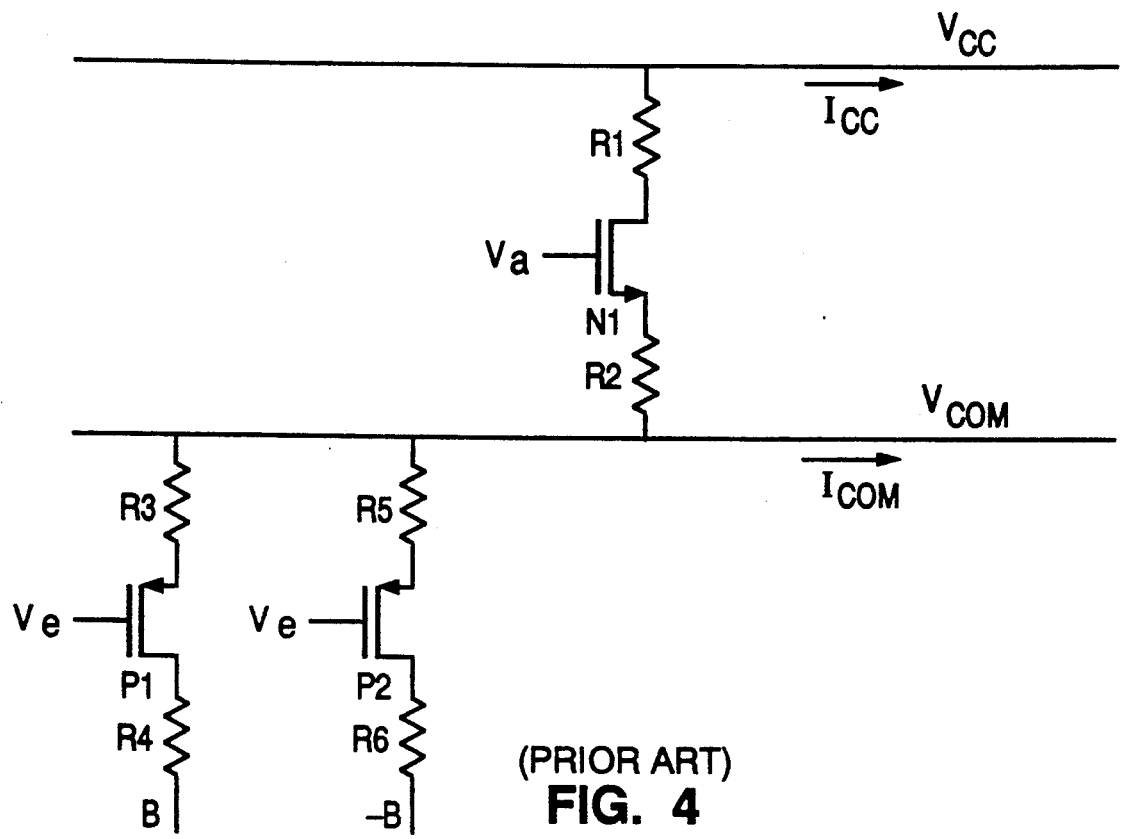
FIG. 4 is a circuit diagram of a fourth conventional bitline pull-up circuit.
Figure 5:
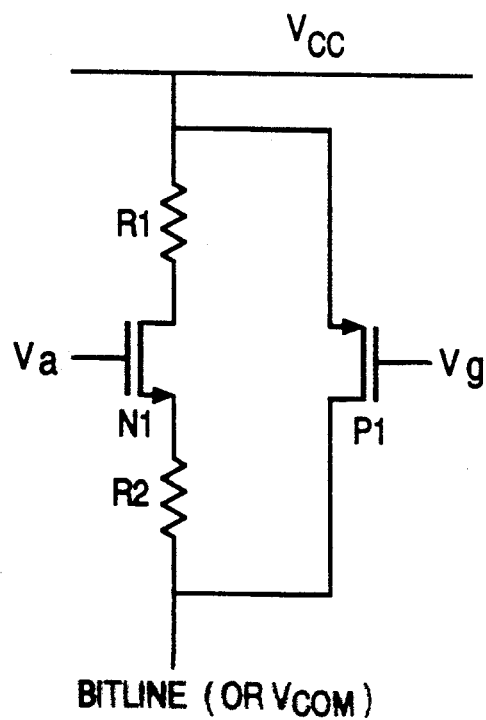
FIG. 5 is a circuit diagram of a preferred embodiment of the inventive circuit.

When transistor P1 is switched off, the first branch of the FIG. 5 circuit operates as a bitline pull-up circuit having high electrical resistance. In this mode (the "normal operating" mode), the first branch raises the bitline selectively to relatively low voltage levels in response to application of control voltage $V_a$ to the gate of transistor N1 (which control voltage selectively switches transistor N1 on and off). Specifically, when transistor N1 is on, the first branch raises the bitline to a first voltage substantially equal to voltage $V_{cc}-V_{Th}$, and when transistor N1 is off, the first branch raises the bitline to a second voltage substantially lower than voltage $V_{cc}-V_{Th}$.

When transistor P1 is switched on (for example, in order to conduct tests of circuitry connected to the bitline), the second branch of the FIG. 5 circuit shunts out the first branch. In this mode, the second branch operates as a bitline pull-up circuit to raise each bitline to a substantially constant voltage level higher than each bitline voltage in the normal operating mode (i.e., a voltage substantially equal to voltage $V_{cc}$, regardless of the value of control voltage $V_a$).

In a "static" bitline pull-up variation of the FIG. 5 circuit, voltage $V_a$ is a constant voltage (not a time-varying control voltage).

Figure 6:
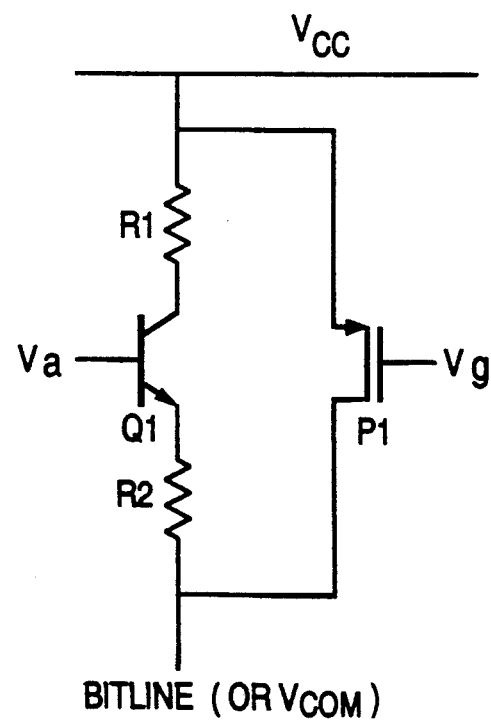
FIG. 6 is a circuit diagram of a second preferred embodiment of the inventive circuit.

The circuit of FIG. 6 also has two parallel branches. The first branch includes bipolar transistor Q1, resistor R1 (connected between the voltage line $V_{cc}$ and the collector of transistor Q1), and resistor R2. Resistor R2 is connected between the emitter of transistor Q1 and the bitline, or between the emitter of transistor Q1 and a line having voltage $V_{com}$ (which is connected to one or more bitlines through transistors). The second branch of the FIG. 6 circuit consists of PMOS transistor P1 whose source is connected to the $V_{cc}$ line and whose drain is connected to the bitline (or the line at voltage $V_{com}$).

When transistor P1 is switched off, the first branch of the FIG. 6 circuit operates as a bitline pull-up circuit having high electrical resistance. In this "normal operating" mode, the first branch raises the bitline selectively to relatively low voltage levels in response to application of control voltage $V_a$ to the base of transistor Q1 (which control voltage selectively switches transistor Q1 on and off).

When transistor P1 is switched on (for example, in a bitline circuit test mode), the second branch of the FIG. 6 circuit shunts out the first branch. In this mode, the second branch operates as a bitline pull-up circuit to raise each bitline to a substantially constant voltage level higher than each bitline voltage in the normal operating mode (i.e., a "high" voltage substantially equal to voltage $V_{cc}$, regardless of the value of control voltage $V_a$). In a "static" bitline pull-up variation of the FIG. 6 circuit, voltage $V_a$ is a constant voltage (not a time-varying control voltage).

Another preferred embodiment of the invention will next be described in FIG. 7. In the FIG. 7 circuit, NMOS transistors N3–N7 are connected to function as diodes, between a pad and a node A. The drain of weak NMOS transistor N2 is connected to node A, and the source of transistor N2 is connected to a line maintained at voltage $V_{ss}$. Voltage $V_{cc}$ is applied to the gate of transistor N2 to keep transistor N2 on.

The bitline pull-up circuit consisting of NMOS transistor N1, resistors R1 and R2, and PMOS transistor P1 (whose drain is connected to a node at voltage $V_{com}$) is identical to the FIG. 5 circuit. The common sources of PMOS transistors P2–P5 are connected to the node at voltage $V_{com}$. The drains of transistors P2, P3, P4, and P5, are respectively connected to bitlines B1, −B1, B2, and −B2. During the normal operating mode of the bitline pull-up circuit, transistor P1 is off and control voltages $V_{e1}$, $V_{e2}$, $V_{e3}$, $V_{e4}$ selectively raise the bitlines to relatively low voltage levels (by selectively switching transistors P2, P3, P4, and P5 on and off).

To trigger a test mode, a high voltage (e.g., 9 volts) is applied to the pad (and hence to the gate and drain of transistor N3), so that the voltage at node A quickly rises to a high level, and the voltage $V_g$ at the output of inverter B (whose input is connected to node A) quickly falls to a low level. Voltage $V_g$ is employed as a control voltage at the gate of transistor P1, so that when voltage $V_g$ falls to such low level, transistor P1 is switched on.

When transistor P1 is on, the voltage $V_{com}$ quickly rises to a substantially constant voltage level, higher than the level it has in the circuit's normal operating mode. Thus, if P1 is on and the control voltages $V_{e1}$, $V_{e2}$, $V_{e3}$, and $V_{e4}$ are set to keep transistors P2–P5 on, each of the four bitlines will be raised to a substantially constant voltage level (i.e., a voltage substantially equal to voltage $V_{cc}$) higher than its level in the normal operating mode.

Figure 7:
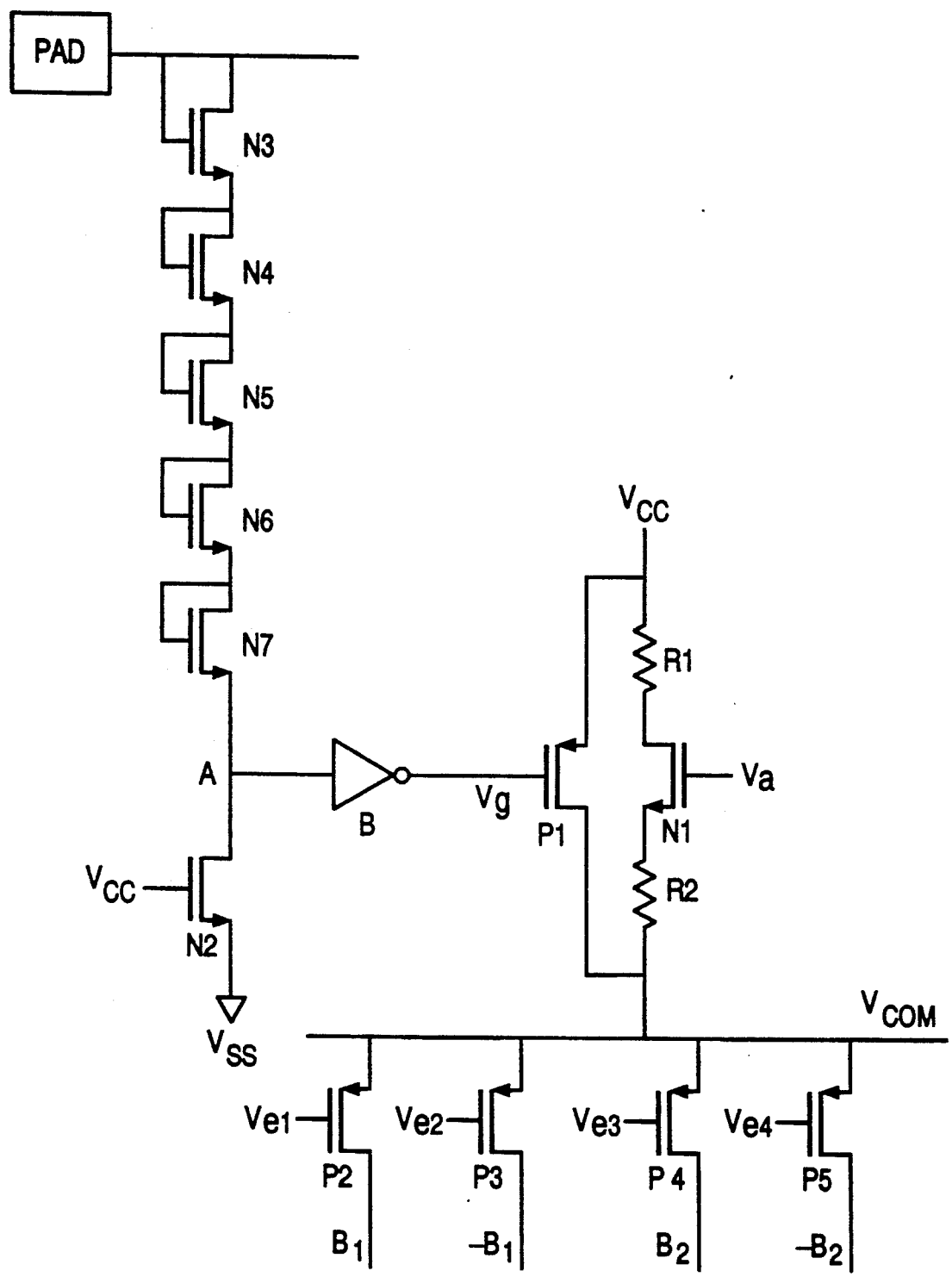
FIG. 7 is a circuit diagram of a third preferred embodiment of the inventive circuit.

Of course, variations on the FIG. 5 and FIG. 7 circuits are possible in which the "second branch" transistor P1 is an NMOS transistor, rather than a PMOS transistor.

In a "static" bitline pull-up variation of the FIG. 7 circuit, voltages $V_{c1}$, $V_{c2}$, $V_{c3}$, and $V_{c4}$ are constant voltages (not time-varying control voltages).

Throughout the claims, the expression "non-control terminal" is used (with reference to PMOS, NMOS, and bipolar transistors) to denote either the source or drain (but not the gate) of a PMOS or NMOS transistor, or the emitter or collector (but not the base) of a bipolar transistor. The expression "control terminal" is used (with reference to PMOS, NMOS, and bipolar transistors) to denote either the gate of a PMOS or NMOS transistor, or the base of a bipolar transistor. The expression "MOS transistor" is used to denote either a PMOS or an NMOS transistor.

Various modifications and alterations in the described apparatus of the invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A circuit, for connection to a first node maintained at voltage $V_{cc}$, including:
    a first branch circuit connected between the first node and a second node, wherein the first branch circuit includes a first transistor having a first control terminal; and
    a second branch circuit including a MOS transistor having a control terminal and non-control terminals, wherein the control terminal receives a mode-selection voltage, a first one of the non-control terminals is connected to the first node, and a second one of the non-control terminals is connected to the second node, wherein at times when the MOS transistor is switched on in response to the mode-selection voltage, the second branch circuit shunts out the first branch circuit and raises the second node to a high voltage level, and at times when the MOS transistor is switched off in response to the mode-selection voltage, the first branch circuit raises the second node to second voltage level, wherein the second voltage level is lower than the high voltage level, and wherein the first control terminal receives a first control voltage that is independent from the mode-selection voltage, wherein the first transistor selectively switches on and off in response to the first control voltage, wherein at times when the MOS transistor is switched off, the first branch circuit raises the second node selectively to one of a first low voltage level and a second low voltage level in response to the first control voltage, and wherein each of the first low voltage level and the second low voltage level is lower than the high voltage level.

2. The circuit of claim 1, wherein the first transistor also has non-control terminals, and wherein the first branch circuit includes a resistor means connected in series with the non-control terminals.

3. The circuit of claim 1, wherein the second node is a bitline.

4. A circuit, for connection to a first node maintained at voltage $V_{cc}$, including:
    a first branch circuit connected between the first node and a second node, including a first transistor and a resistor means, wherein the first transistor has a control terminal for receiving a first control voltage in response to which the first transistor selectively switches on and off, wherein the first transistor has non-control terminals, and wherein the resistor means is connected in series with the non-control terminals; and
    a second branch circuit including a MOS transistor having a control terminal and non-control terminals, wherein the control terminal receives a mode-selection voltage, a first one of the non-control terminals is connected to the first node and a second one of the non-control terminals is connected to the second node, wherein at times when the MOS transistor is switched on in response to the mode-selection voltage, the second branch circuit shunts out the first branch circuit and raises the second node to a high voltage level, and at times when the MOS transistor is switched off in response to the mode-selection voltage, the first branch circuit raises the second node selectively to low voltage levels in response to the first control voltage, wherein the first control voltage is independent from the mode-selection voltage.

5. The circuit of claim 4, wherein the high voltage level is substantially equal to the voltage $V_{cc}$.

6. The circuit of claim 4, wherein the second node is a bitline.

7. The circuit of claim 4, also including:
    a set of PMOS transistors having common sources connected to the second node, wherein each of the PMOS transistors has a drain connected to a bitline.

8. The circuit of claim 4, wherein the first transistor is a MOS transistor having a drain and a source, the resistor means includes a first resistor connected in series with the source of the first transistor and a second resistor connected in series with the drain of the first transistor, and wherein the second branch circuit is a PMOS transistor.

9. The circuit of claim 8, wherein the PMOS transistor has a source connected to the first node and a drain connected to the second node.

10. The circuit of claim 4, wherein the first transistor is a bipolar transistor having an emitter and a collector, the resistor means includes a first resistor connected in series with the emitter of the first transistor and a second resistor connected in series with the collector of the first transistor, and wherein the second branch circuit is a PMOS transistor.

11. The circuit of claim 4, wherein the second branch circuit also includes:
    second control voltage generation means for generating the mode-selection voltage and supplying said mode-selection voltage to the control terminal of the MOS transistor.

12. The circuit of claim 11, wherein the second control voltage generation means includes:
    a third node for receiving a third control voltage;
    a diode means connected between the third node and a fourth node; and
    a second MOS transistor having a drain connected to the fourth node and a source connected to a fifth node maintained at a voltage $V_{cc}$.

13. The circuit of claim 12, wherein the MOS transistor is a PMOS transistor having a gate, and wherein an inverter means is connected between the fourth node and the gate of the PMOS transistor.

14. A circuit, for connection to a first node maintained at voltage $V_{cc}$, including:
   a first branch circuit connected between the first node and a second node, including a first MOS transistor and a resistor means, wherein the first MOS transistor has a gate for receiving a first control voltage in response to which the first MOS transistor selectively switches on and off, wherein the first MOS transistor has a source and a drain, and wherein the resistor means is connected in series with the source and the drain of the first MOS transistor; and
   a second branch circuit including a second MOS transistor having a control terminal and non-control terminals, wherein the control terminal receives a mode-selection voltage, a first one of the non-control terminals is connected to the first node and a second one of the non-control terminals is connected to the second node, wherein at times when the second MOS transistor is switched on in response to the mode-selection voltage, the second branch circuit shunts out the first branch circuit and raises the second node to a high voltage level, and at times when the second MOS transistor is switched off in response to the mode-selection voltage, the first branch circuit raises the second node selectively to low voltage levels in response to the first control voltage, wherein the first control voltage is independent from the mode-selection voltage.

15. The circuit of claim 14, wherein the second node is a bitline.

16. The circuit of claim 14, also including:
   a third MOS transistor having a first non-control terminal connected to the second node, and a second non-control terminal connected to a bitline.

17. A circuit, for connection to a first node maintained at voltage $V_{cc}$, including:
   a first branch circuit connected between the first node and a second node, including a bipolar transistor and a resistor means, wherein the bipolar transistor has a base for receiving a first control voltage in response to which the bipolar transistor selectively switches on and off, wherein the bipolar transistor has a collector and an emitter, and wherein the resistor means is connected in series with the collector and the emitter of the bipolar transistor; and
   a second branch circuit including an MOS transistor having a control terminal and non-control terminals, wherein the control terminal receives a mode-selection voltage, a first one of the non-control terminals is connected to the first node and a second one of the non-control terminals is connected to the second node, wherein at times when the MOS transistor is switched on in response to the mode-selection voltage, the second branch circuit shunts out the first branch circuit and raises the second node to a high voltage level, and at times when the MOS transistor is switched off in response to the mode-selection voltage, the first branch circuit raises the second node selectively to low voltage levels in response to the first control voltage, wherein the first control voltage is independent from the mode-selection voltage.

18. The circuit of claim 17, wherein the second is a bitline.

19. The circuit of claim 17, also including:
   a second MOS transistor having a first non-control terminal connected to the second node, and a second non-control terminal connected to a bitline.

20. A method for selectively connecting a first node maintained at voltage $V_{cc}$ to a second node, including the steps of:
   (a) applying a first control voltage to a first branch circuit connected between the first node and the second node, to cause said first branch circuit to raise the second node selectively to low voltage levels in response to the first control voltage; and
   (b) applying a second control voltage to a transistor having a control terminal and non-control terminals, wherein a first one of the non-control terminals is connected to the first node and a second one of the non-control terminals is connected to the second node, and wherein the control terminal receives the second control voltage and the second control voltage selectively switches on the transistor, thereby shunting out the first branch circuit and raising the second node to a high voltage level, wherein the second control voltage is independent from the first control voltage.

21. The method of claim 20, wherein the second node is a bitline.

22. The method of claim 20, wherein a set of PMOS transistors having common sources are connected to the second node, wherein the PMOS transistors have drains connected to bitlines, and wherein during step (b), at least one of the PMOS transistors is switched on, and each of the bitlines connected to said at least one of the switched on PMOS transistors is raised to said high voltage level.

23. A method for selectively connecting a first node maintained at voltage $V_{cc}$ to a second node, including the steps of:
   (a) applying a first voltage to a first branch circuit connected between the first node and the second node, to cause said first branch circuit to raise the second node to a first voltage level; and
   (b) applying a second control voltage to a transistor having a control terminal and non-control terminals, wherein a first one of the non-control terminals is connected to the first node and a second one of the non-control terminals is connected to the second node, and wherein the control terminal receives the second control voltage and the second control voltage selectively switches on the transistor, thereby shunting out the first branch circuit and raising the second node to a second voltage level, wherein the second voltage level is higher than the first voltage level, and wherein the first control voltage is independent from the second control voltage.

24. The method of claim 23, wherein the second node is a bitline.

* * * * *